United States Patent [19]
Greenwood et al.

[11] Patent Number: 5,679,498
[45] Date of Patent: Oct. 21, 1997

[54] METHOD FOR PRODUCING HIGH DENSITY MULTI-LAYER INTEGRATED CIRCUIT CARRIERS

[75] Inventors: Jonathon G. Greenwood, Boynton Beach; Douglas W. Hendricks, Boca Raton; Frank Juskey, Coral Springs, all of Fla.

[73] Assignee: Motorola, Inc., Schaumburg, Ill.

[21] Appl. No.: 540,873

[22] Filed: Oct. 11, 1995

[51] Int. Cl.⁶ .................................. G03F 7/38; G03F 7/40
[52] U.S. Cl. .......................... 430/312; 430/313; 430/314; 430/315; 430/316; 430/317; 430/318
[58] Field of Search .................................. 430/312, 313, 430/314, 315, 316, 317, 318

[56] References Cited

U.S. PATENT DOCUMENTS 4,643,935   2/1987   McNeal et al. .................... 428/157

Primary Examiner—Christopher G. Young
Attorney, Agent, or Firm—Philip P. Macnak

[57] ABSTRACT

A method of producing multi-layered chip carriers by coating the surface of a base layer with a photosensitive dielectric material which forms a dielectric layer; curing at least a portion of the dielectric layer by exposure to radiation; depositing a catalyst on the cured portion of the dielectric layer to form a sensitized dielectric layer; applying a photoresist layer upon the sensitized dielectric layer; curing at least a portion of the photoresist layer; developing the cured photoresist layer by removing uncured portions, thereby exposing corresponding portions of the underlying sensitized dielectric layer; forming conductors on the exposed dielectric layer; stripping the cured photoresist layer: coating a layer of photosensitive dielectric material upon the cured dielectric layer; and repeating the steps to produce successive layers which form a multi-layer chip carrier having a plurality of conductor layers separated by layers of insulating dielectric material.

12 Claims, 9 Drawing Sheets

METHOD FOR PRODUCING HIGH DENSITY MULTI-LAYER INTEGRATED CIRCUIT CARRIERS

FIELD OF THE INVENTION

This invention generally relates to a method of producing integrated circuit packages and printed circuit boards, and more particularly to a method for producing high density multi-layer chip carrier packages and printed circuit boards.

BACKGROUND OF THE INVENTION

Improvements in performance characteristics of electrical devices, particularly integrated circuits, advanced microchips, and printed circuit boards, continue to be made while the size of such devices continues to be reduced. In the 1960's and 1970's, chips were relatively simple, and most were housed in simple chip packages comprising a simple plastic case with a dozen or so metal conductors protruding from two sides for providing input/output connections. Multiple chips were mounted on a single board having metallic conductors printed on its surface ("Printed Circuit Board" or "PCB") such that chips were capable of sending and receiving electronic signals from one chip package to another. Recent developments in technology have enabled chip designers and fabricators to increase the number of functions performed by a chip and housed within a single chip package. In addition, chips have become more powerful as the speed at which various functions can be performed has increased significantly. However, delays resulting from the time required to transmit signals between chip packages continue to adversely affect processing efficiency.

Chip package designers now seek to maximize processing efficiency by compressing or packing as many functions as possible onto a single chip, and, further, by packing ever increasing numbers of chip packages onto the smallest possible circuit boards. The large number of functions or devices packed into modern chip packages requires an increase in the number of chip input/output leads or pins to facilitate the increased demand for and number of input/output signals. Such leads protrude from the chip package and provide electrical connection between the integrated circuitry housed within the package and conductors on the printed circuit board. The increase in leads protruding from modern chips forced chip manufacturers to design chip packages having conductors protruding from all sides in an effort to increase the number of electrical connections without using additional board space. More powerful chips, such as microprocessors, are now designed such that the package base is penetrated by an entire grid of fine, closely spaced, leads, which permits the entire undersurface of the package to be used for electrical connections.

Accordingly, modern complex chip circuitry having a corresponding large number of leads, requires that the printed circuit boards upon which these chips shall be mounted contain an ever increasing number of metal conductors for transferring electronic signals. The resulting space limitations forced designers to create sandwich style circuit boards having multiple layers of wiring to handle the large number of chips and leads.

The printed circuit board supports a number of electronic components mounted on its surface and links them electronically. A PCB consists of a nonconductive base or core, typically fabricated from an epoxy coated glass weave, and a thin layer of metal, such as copper, which may be etched, in accordance with prior art subtractive etching technology, to form a pattern of electrical conductors. While the simplest PCB's have a single layer of wiring, typically mounted on the bottom, many more components may be connected and many more signals handled by adding additional conductors to the top surface. With advances in technology, many circuits now require multiple layers of conductors to be sandwiched between laminated insulating layers of epoxy coated glass weave boards which are typically bonded together with adhesive layers of a material known as "prepreg."

Multiple layers of conductors, separated by non-conducting material, also make it possible for electrical paths to cross without causing a short circuit. This is made possible by having conductors on alternating layers run at right angles to each other such that a signal that must change direction en route to its destination follows a path up or down through insulating layers along conducting holes, known as "vias," thereby electrically communicating one conductor with a conductor on a different layer and allowing the signal to continue toward its destination. Vias are created by mechanically drilling holes through the board to connect the circuits. The holes are then cleaned and primed with a chemically deposited layer of copper. Conventional chemical and electroplating techniques are used to build up a copper layer on the via walls to connect the different circuit layers. The drilling process, however, is costly, time consuming and limited by manufacturing tolerances that are difficult to control.

In accordance with the prior art, the manufacture of the commonly used glass-laminate boards begins by impregnating rolls of glass fiber reinforcing material with bonding resin. After impregnation, the board is passed through rollers to remove any excess resin and then semi-cured in a drying oven. The conductor pattern is produced by panel plating the board with a thin copper film layer; applying a film layer of photoresist, which hardens or sets with exposure to radiation, over the copper layer; masking the photoresist with a transparent sheet containing a photographic transparency of the circuitry layout; exposing the masked photoresist to a radiation source thereby causing the exposed photoresist to cure; removing the soft, or uncured, photoresist using a chemical bath thereby exposing portions of the underlying copper; removing the exposed copper using a chemical etchant; and stripping away the cured photoresist thereby exposing the conductor pattern. Alternatively, in a pattern plating process, the photographic transparency may contain a positive image of the desired conductor pattern such that, after exposure, the developing process removes the uncured photoresist thereby exposing the pattern of conductors which is then coated with tin, or other suitable material, to protect the conductors when the remaining material is removed. The aforementioned methods of obtaining copper conductor patterns on printed circuit boards are known as subtractive processes, and are costly and inefficient as they require a large number of process steps, and result in a large amount of waste as a substantial amount of copper must be etched away to obtain the desired conductor pattern. While much of the etched copper may be reclaimed, reclamation adds further to the cost of production.

A common integrated circuit package of the prior art is comprised of a plurality of thin flat ceramic layers which are laminated together with adhesive layers of prepreg, and which has a cavity that holds an integrated circuit chip. The cavity in cross section has staircase shaped sidewalls. Patterned electrical conductors lie on the surfaces of the ceramic layers and on the steps of the cavity. The conductors terminate on the cavity steps in the shape of wire bonding pads. Individual wires are bonded between the bonding pads and the integrated circuit chip to carry signals to and from the chip.

The staircase shaped cavity provides several rows of bonding pads around the chip thereby enabling a large number of electrical connections with the chip. An example of such a configuration is found in U.S. Pat. No. 4,643,935, issued to NcNeal et al., which discloses an epoxy-glass integrated circuit package having bonding pads in a stepped cavity in which an integrated circuit is disposed. However, creation of the staircase shaped cavity requires routing various sized openings in each ceramic or epoxy-glass layer with a mechanical routing device. The routing process suffers from similar disadvantages experienced by the aforementioned drilling process; routing is costly, time consuming and limited by manufacturing tolerances that are difficult to control. Naturally, these disadvantages are multiplied with each layer in a multi-layered package.

For the forgoing reasons, multi-layered chip packages and PCB's are difficult and costly to fabricate. The need for mechanical drilling, routing and laminating not only complicate the manufacturing process but also result in numerous quality control problems resulting from limitations inherent in mechanical machining and bonding. Constructing multi-layered chip packages and PCB's in accordance with the prior art also reduces the effectiveness of miniaturization efforts as each layer of core material (ceramic or epoxy-glass), and prepreg adhesive, adds additional thickness.

Accordingly, there exists a need for a process for fabricating multilayered integrated circuit packages and printed circuit boards that overcome these disadvantages.

As used herein the word "package" refers to an enclosure for housing electronic components or devices and permitting convenient electrical coupling thereto. The words "pad(s)" or "bonding pad(s)" refer to mutual regions on the device, e.g. a semiconductor chip, suitable for attachment of wire bonds or other connection means. The words "bonding area(s)" refer to metallic regions on the package or enclosure suitable for attachment of wire bonds or other connection means from the device. The word "lead(s)" refers to the parts of the package where connection is made to the external socket or circuit. The word "wirebonding" refers to the process of attaching wire bonds between chip bonding pads and package bonding areas. The words "printed circuit board" or "PCB" refer to at least one layer typically fabricated from an epoxy-glass core having metalized conductors on at least one surface. The word "via(s)" refers to an aperture existing on a ceramic or epoxy-glass layer in a chip package or PCB. The word "photoresist" refers generally to a chemical coating that cures or hardens with suitable exposure to light or radiation. "Imaging" refers to exposing photoresist to light or radiation such that a portion of the photoresist is caused to cure. "Developing" refers to the process of removing uncured photoresist or dielectric from a particular surface. "Etch" or "etching" refers to the removal of copper or other conducting material from a particular surface. "Strip" or "stripping" refers to the removal of cured photoresist or dielectric from a particular surface.

These disadvantages are overcome, and other advantages realized, by the instant method for producing multi-layer integrated circuit packages and printed circuit boards (hereinafter collectively "chip carriers"). In accordance with the instant invention, a multi-layer chip carrier is produced by a method including the following steps: (a) obtaining a base layer of epoxy coated glass weave, or other suitable core material, having patterned electrical conductors formed thereon; (b) coating the base layer with a photosensitive dielectric material to form a dielectric layer; (c) masking the dielectric layer with a partially transparent sheet whereby predetermined areas of the photosensitive dielectric material are masked by opaque artwork (egg. for creating vias); (d) imaging the masked dielectric layer by exposure to a suitable radiation source thereby causing the exposed dielectric to cure; (e) developing the masked dielectric layer thereby removing uncured dielectric material with a chemical wash, forming vias communicating with the underlying patterned electrical conductors; (f) depositing a catalyst upon the cured portion the surface of the cured dielectric layer to form a sensitized dielectric layer (g) applying a photoresist layer over the sensitized dielectric layer; (h) masking the photoresist layer with a transparent sheet containing opaque areas corresponding to the desired circuitry layout; (i) exposing the masked photoresist layer to ultra-violet radiation thereby curing portions of the photoresist layer which are unmasked; (j) developing the photoresist layer using a chemical solution to remove uncured portions of the photoresist layer, such that portions of the sensitized dielectric layer, representing areas for conductor circuitry, are exposed; (k) forming conductors upon the exposed sensitized dielectric layer (m) stripping the remaining (cured) photoresist layer using a chemical solution; (m) plating bonding pad areas with successive layers of copper, nickel, and gold; applying a layer of photosensitive dielectric material over the cured dielectric layer having patterned electrical conductors; and, repeating steps (b) through (m) as often as necessary to form a multi-layer chip carrier.

An object of the instant invention is to provide an improved method for producing multi-layered integrated circuit chip carriers having thin layers of dielectric material, in lieu of relatively thick epoxy coated glass weave boards, separating layers of conductors, and thereby resulting in a smaller/thinner chip carrier.

A further object of the instant invention is provide an improved method for producing multi-layer chip carriers whereby the steps of masking, imaging and developing photosensitive dielectric material allow for the formation of openings (e.g. vias) in the insulating dielectric layers without the need for inefficient mechanical drilling or routing.

Still another object of the instant invention is to provide an improved method for producing multi-layer chip carriers whereby complex, irregular, and intricate openings may be formed in insulating layers by a photosetting process.

Yet another object of the instant invention is to provide an improved method for producing multi-layer chip carriers that eliminates the costly and inefficient lamination process required for bonding layers of rigid boards.

A further object of the instant invention is to provide an improved method for producing multi-layer chip carriers wherein metal conductors are formed on successive layers by an additive electroplating process.

Still another object of the instant invention is to provide an improved method for producing multi-layer chip carriers whereby the thickness of insulating layers is reduced to approximately 0.0007"–0.0009", a reduction of approximately 75 percent over prior art multi-layer chip carriers produced by prior art rigid board technology.

Yet another object of the instant invention is to provide an improved method for producing multi-layer chip carriers capable of producing conductor patterns wherein individual conductors are formed having widths of approximately 0.001 inches.

DESCRIPTION OF THE PREFERRED EMBODIMENT

Figure 1:
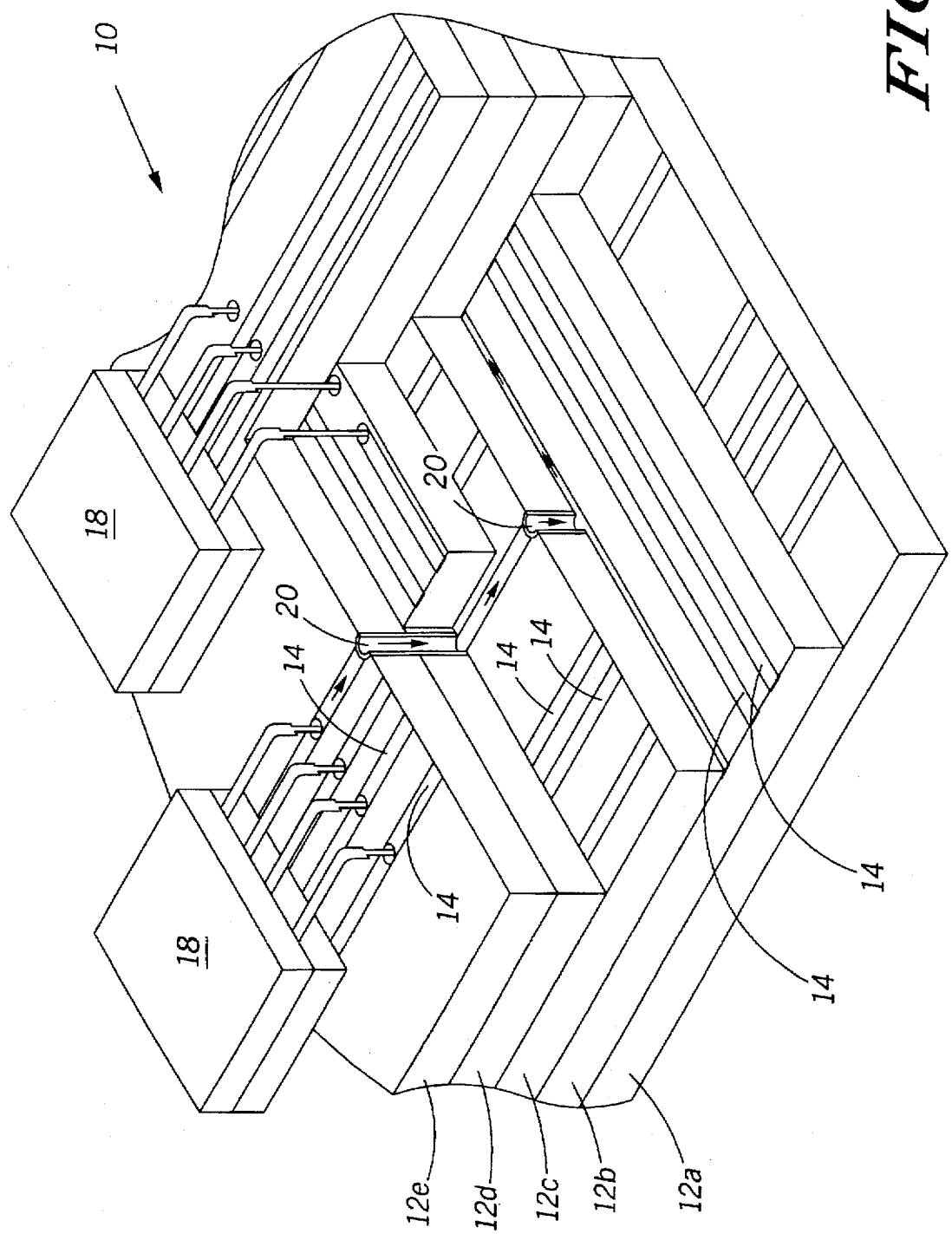
FIG. 1. is a perspective view, in partial section, of a prior art multi-layer printed circuit board.

With reference to the drawings, FIG. 1 represents a prior art multilayer printed circuit board ("PCB"), depicted generally as 10. The prior art circuit board includes a plurality of core layers 12a–e, each having patterned conductors 14 thereon. Core layers 12a–e comprise epoxy coated glass weave material for forming a rigid substrate. The core layers are laminated to form a multi-layer structure using an adhesive known as prepreg (not shown). Five levels of circuitry in this PCB permit a pulse of data (arrows), from a chip package 18, to reach a destination by traveling under selected layers. As the pulse is unable to link directly with its destination without crossing other conductors, the route first descends by means of one or more conductive holes called vias 20, to a layer of conductors that travel in the appropriate direction.

Figure 2:
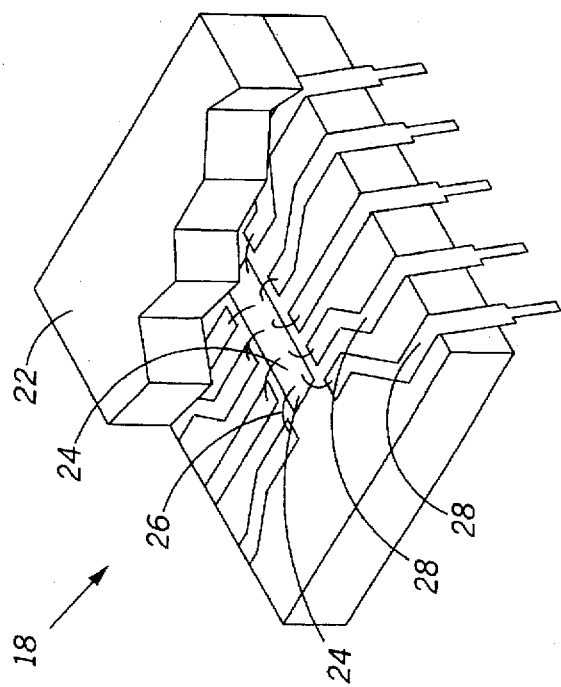
FIG. 2. is a perspective view, in partial section, of a prior art single-layer chip package.

FIG. 2 depicts a prior art chip package 18 having a casing 22 housing an integrated circuit ("chip") 24. A plurality of fine wires 26 connect the chip to a pattern of metal leads 28 which provide electrical connection to the conductors 14 on circuit board 10.

Figure 3:
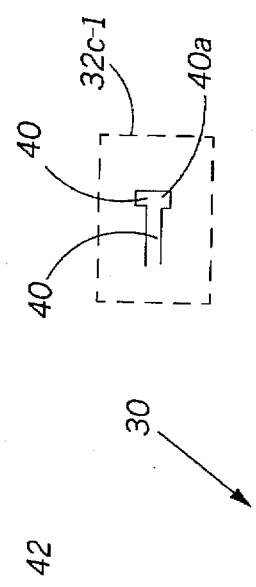
FIG. 3. is a sectional view of a prior art multi-layer chip package.
Figure 3:
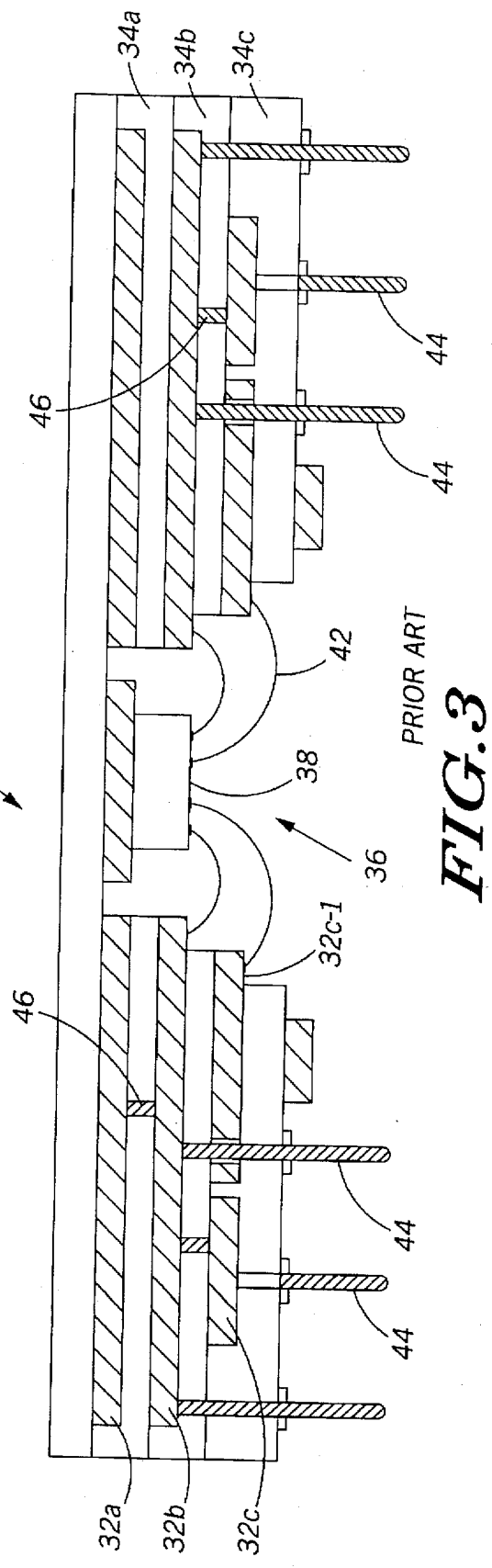

FIG. 3 depicts a multi-layer chip package 30, according to the prior art, in section. Package 30 is constructed of multiple epoxy glass layers 32a–c held together by respective adhesive layers of prepreg 34a–c which lie between the epoxy-glass layers. Package 30 incorporates a cavity 36 in which an integrated circuit chip 38 is disposed. The cavity 36 penetrates through layers 34c, 32c, 34b, 32b, 34a, and 32a. In cross section, cavity 36 is stepped or staircase-shaped so that it exposes a portion or area 32c–1 of the flat surface of layer 32c. Layers 32a, 32b, and 32c have patterned electrical conductors on their flat surface. The conductors are too thin to appear in the cross sectional view of FIG. 3, however, one such conductor is shown from the top view by reference numeral 40. These conductors are provided to carry electrical signals to and from chip 38. To accomplish that, each conductor includes a bonding pad 40a on one of the exposed surface portions 32c–1 and 32b–1.

Signals are carried between the bonding pads 40a and corresponding pads on chip 38 by a plurality of discrete bonding wires 42. To carry signals to and from the package 30, a plurality of metal leads 44 are provided which make contact with conductors 40. These leads are also represented by reference numeral 28 in FIG. 2. In addition, package 30 incorporates vias 46 comprising metal plated holes in contact with conductors 40 on two layers which allow signals to transfer from one layer to another in route to a particular destination.

Figure 4:
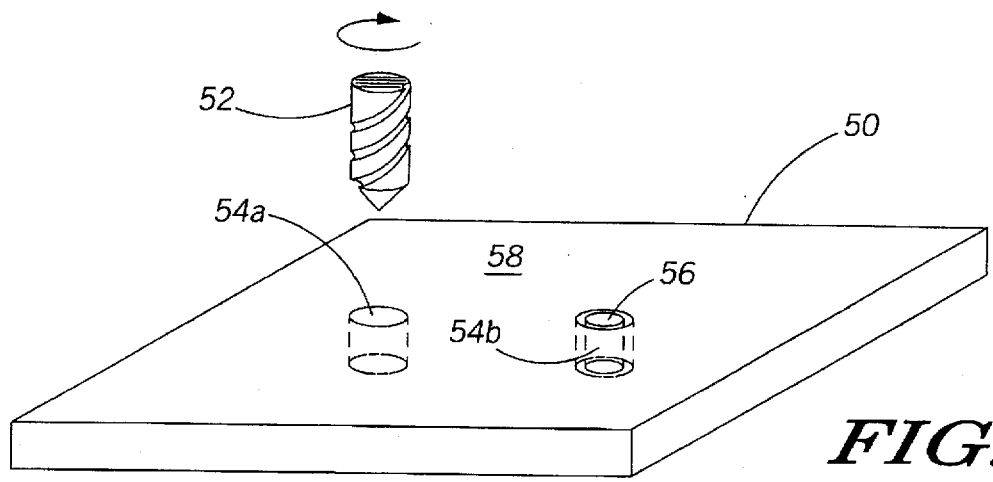
FIG. 4. illustrates the steps of machining of circuit board core material for creating vias.
Figure 5:
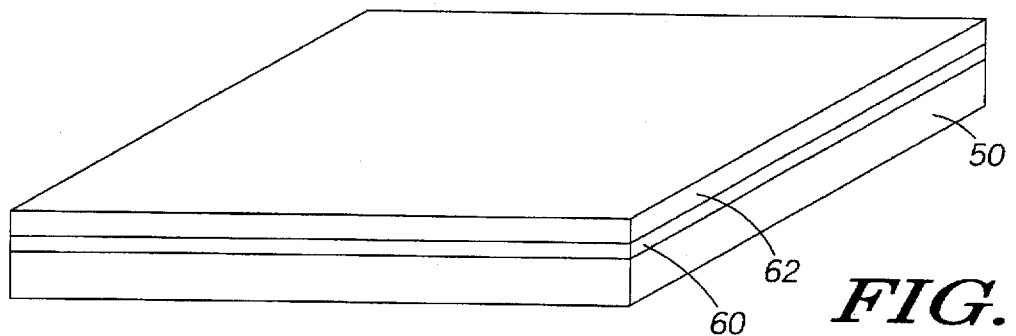
FIG. 5. illustrates a base layer of core material plated with copper and coated with a top layer of photoresist.

With reference now to FIGS. 4–18, and in accordance with the instant invention, an epoxy coated glass weave core, or other suitable material known in the art, provides a substrate 50 upon which the present multi-layer chip carrier may be fabricated. The core material commonly has a thickness of between 0.003"–0.004". Depending on the design, it may be necessary to mechanically drill or route openings in the core material as is known in the art, and as illustrated in FIG. 4. Accordingly, precision drilling machinery 52 is used in creating openings 54a and 54b in core 50. These openings may be plated with conducting material 56 by known plating techniques to form conducting vias.

Figure 6:
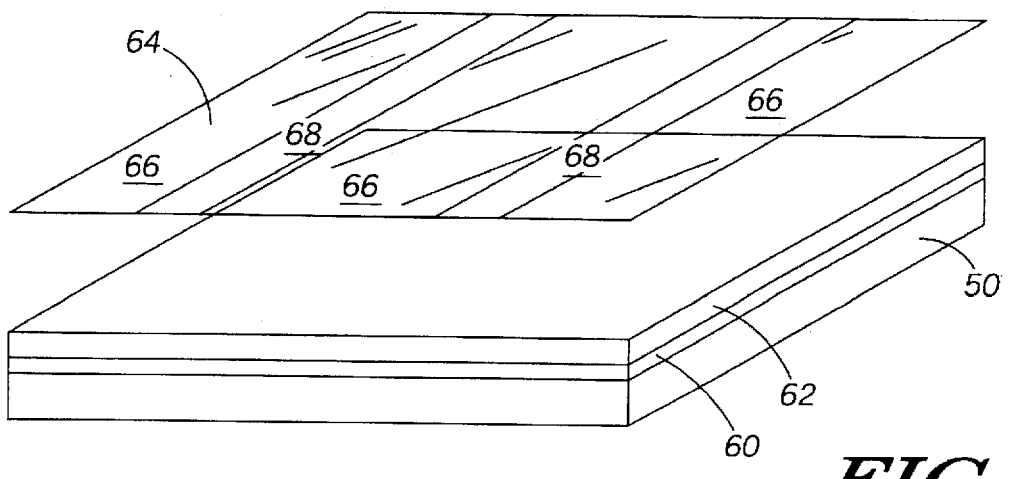
FIG. 6. illustrates the steps of masking of the photoresist layer with a transparent sheet.

A conductor pattern is produced thereon by any suitable manufacturing technique. In the preferred embodiment, illustrated in FIG. 5, a top surface 58 of the core material is panel plated with a thin metallic film 60, such as copper, providing material upon which can be deposited patterned conductors. The copper film is coated with a film layer of photoresist 62 that cures when exposed to radiation. Next, as illustrated in FIG. 6, the photoresist layer 62 is masked with a transparent, dimensionally stable, sheet 64 containing a negative image of the conductor circuitry layout. Accordingly, selected portions of the underlying photoresist are masked by opaque areas 66, defining the desired conductor patterns 68 on the otherwise transparent sheet.

Figure 7:
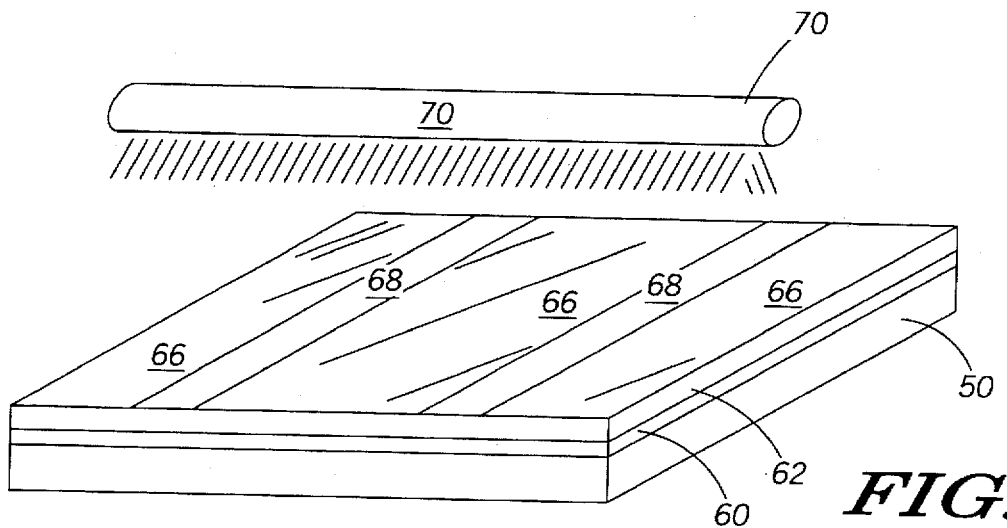
FIG. 7. illustrates the steps of imaging of masked photoresist.
Figure 8:
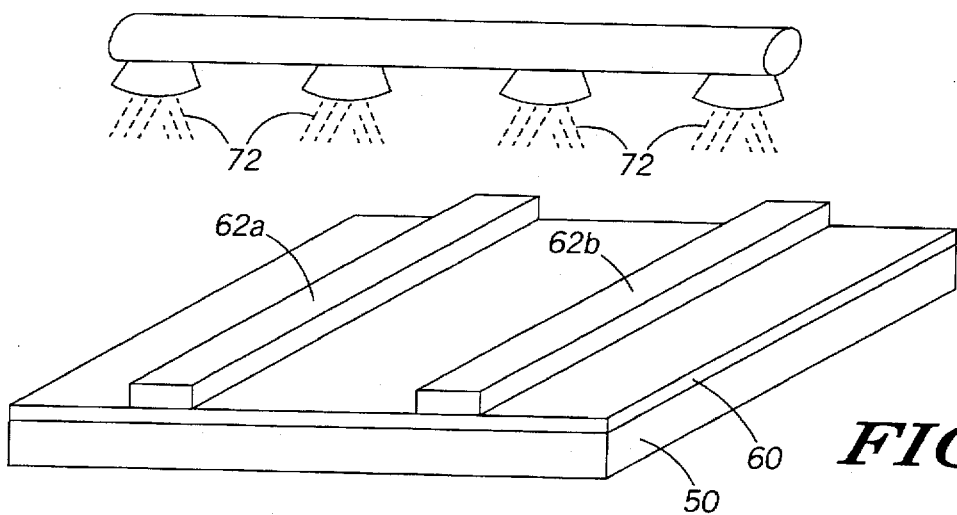
FIG. 8. illustrates the steps of developing photoresist using a chemical solution.

As illustrated in FIG. 7, the masked photoresist layer 62 is then exposed to a radiation source 70 thereby causing the exposed areas of photoresist to cure. Portions of photoresist which have been masked, and hence were not cured by exposure to radiation source 70, are then developed or removed, by a chemical wash 72 such as an aqueous solution including a concentration of from 1 to 3 percent sodium carbonate as illustrated in FIG. 8. While the illustration of FIG. 8 depicts spraying chemical wash 72, any suitable means of applying wash 72 is within the scope of the instant invention. As a result, the developed photoresist layer now exposes portions of the underlying copper 60 corresponding to the opaque patterns found on masking sheet 64.

Figure 9:
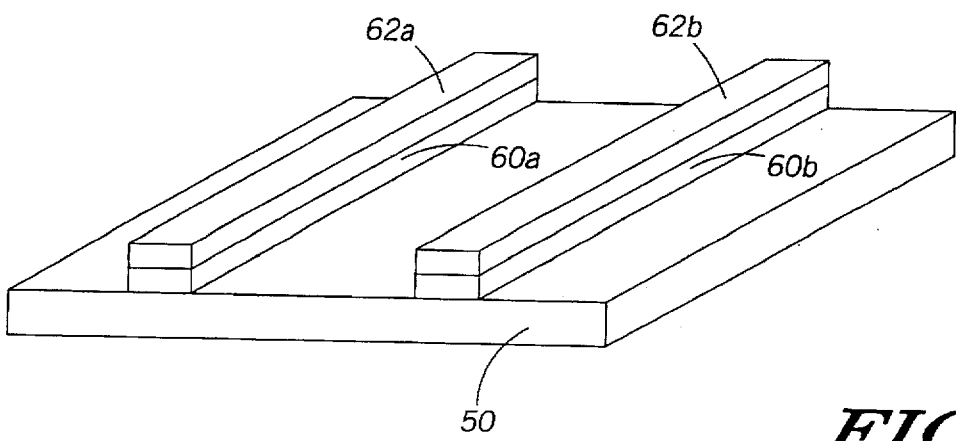
FIG. 9. illustrates the results of etching exposed copper from the core surface.
Figure 10:
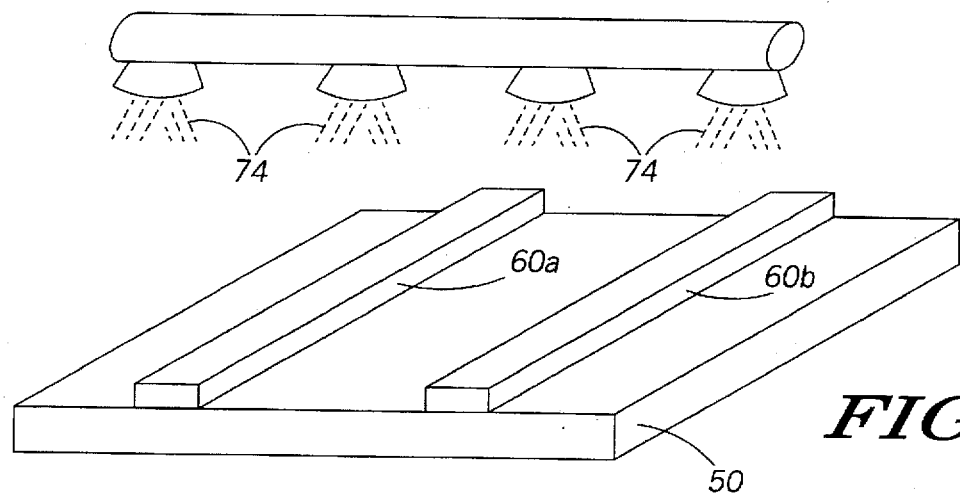
FIG. 10. illustrates the steps of stripping of cured photoresist.

Next, the exposed copper is removed by a chemical etchant which may include a concentration of cupric chloride. During the etching process, portions of cured photoresist 62a and 62b protect corresponding underlying copper from the etching process such that the protected copper 60a and 60b is not etched and thus remains as illustrated in FIG. 9. The cured photoresist is then stripped away by a chemical solution, such as an aqueous solution 74 including a concentration of 5 to 7 percent sodium carbonate, thereby exposing copper conductors 60a and 60b, as illustrated in FIG. 10.

Alternatively, in a pattern plating process, the photographic transparency may contain a positive image of the desired conductor pattern such that, after exposure, the developing process removes the uncured photoresist thereby exposing the pattern of conductors which is then coated with solder, or other suitable material, to protect the conductors when the remaining photoresist and copper that it shielded from the plating process are removed. The aforementioned methods of panel plating and pattern plating to obtain copper conductor patterns on printed circuit boards are termed to subtractive processes.

With the prior art methods, the aforementioned steps are typically repeated and multi-layer PCB's, or other chip carriers, are manufactured by stacking and bonding a plurality of boards into multi-layer configurations. Connections between various circuit layers are made by conducting vias, which are mechanically drilled through the board(s), to connect conductor circuitry, and are then cleaned and primed with a chemically deposited layer of copper by an electroless process. Conventional plating techniques are then used to build up a copper layer in the holes to electrically connect the different circuit layers.

Figure 11:
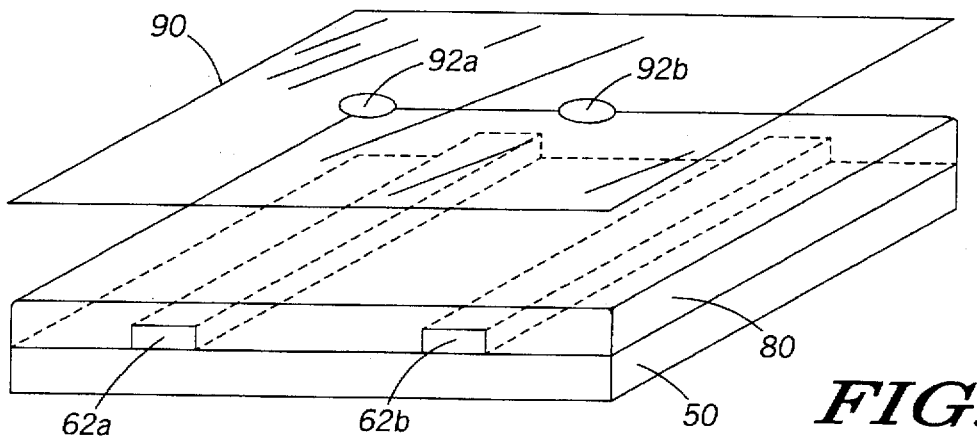
FIG. 11. illustrates the steps of masking of an applied layer of dielectric material.

The instant invention, however, improves upon prior art methods and contemplates the following method for fabricating multi-layered chip carriers. As best illustrated in FIG. 11, core material having a surface with conductors patterned thereon is created in accordance with the prior art. The patterned surface is then coated with a uniform layer, approximately 0.0007"–0.0009" in thickness, of photosensitive dielectric material 80 which is allowed to dry, thereby forming an electrically insulating layer. As prior art core material is typically 0.003" to 0.004" thick, the use of dielectric material, in lieu of a second layer core material, reduces the physical dimensions of the chip carrier thickness by approximately 75% per layer over the prior art.

Figure 13:
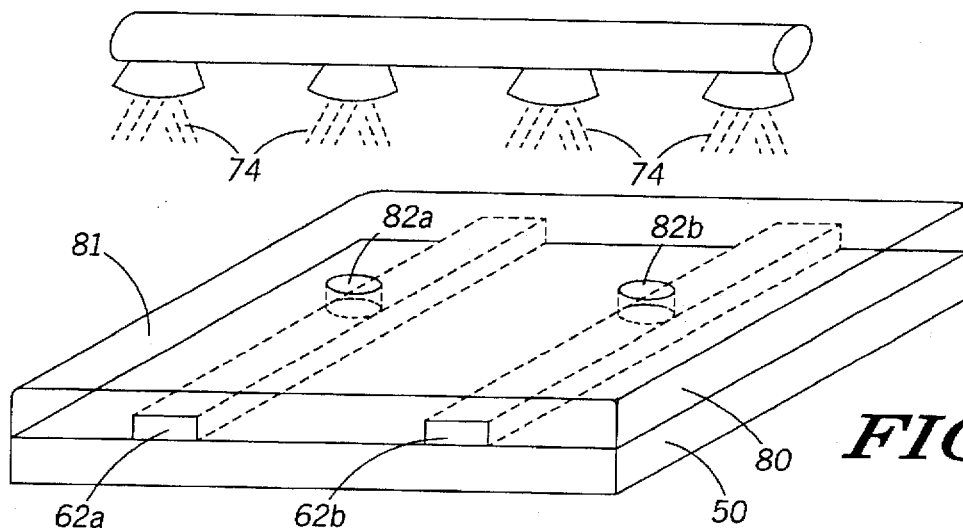
FIG. 13. illustrates the steps of developing dielectric using a chemical solution and chemically sensitizing the dielectric surface.

A further advantage realized by the use of dielectric material in lieu of additional layers of prior art core material in building the chip carrier structure is realized by the elimination of mechanical machining for forming vias. Specifically, as illustrated in FIGS. 11 13, the use of dielectric material allows for the formation of vias, as well as other structural openings, by masking the dielectric with a transparent, dimensionally stable sheet 90 containing opaque portions 92a and 92b corresponding to the size and location of desired openings, such as vias, imaging the masked dielectric by exposure to an ultra-violet radiation source 70, and developing the surface by removing uncured dielectric material with a suitable chemical solution 74, thereby exposing vias 82a and 82b communicating with underlying conductors 62a and 62b as best seen in FIG. 13.

For example, the creation of a via in the dielectric layer is facilitated by exposing the masked dielectric to radiation with masking sheet 90 having an opaque area conforming to the desired via size and location. The developing process then removes the uncured dielectric material which, in the case of a via, exposes a copper conductor (62a, 62b) found on the lower layer. Vias formed in the dielectric layer in accordance with the instant method are subsequently cleaned, sensitized, and plated with copper conducting material, 84a and 84b in FIG. 14, by known plating techniques. Creating vias in the dielectric layer by this method provides a significant improvement over prior art machining methods and easily allows for the formation of complex and irregularly shaped openings, such as square shaped vias, which were not practical with the prior art methods, thereby paving the way for further technological innovations in chip carrier design that were not possible given the limitations of mechanical drilling and routing techniques.

Figure 14:
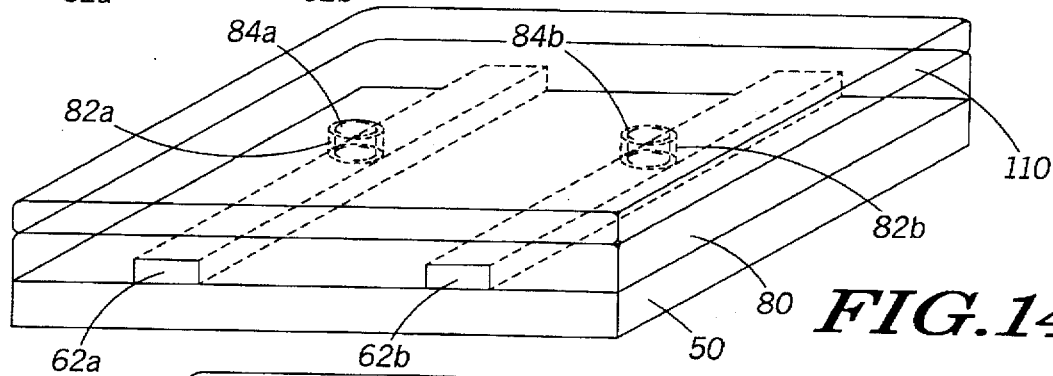
FIG. 14. illustrates the application of a photoresist coating upon a developed dielectric layer.
Figure 15:
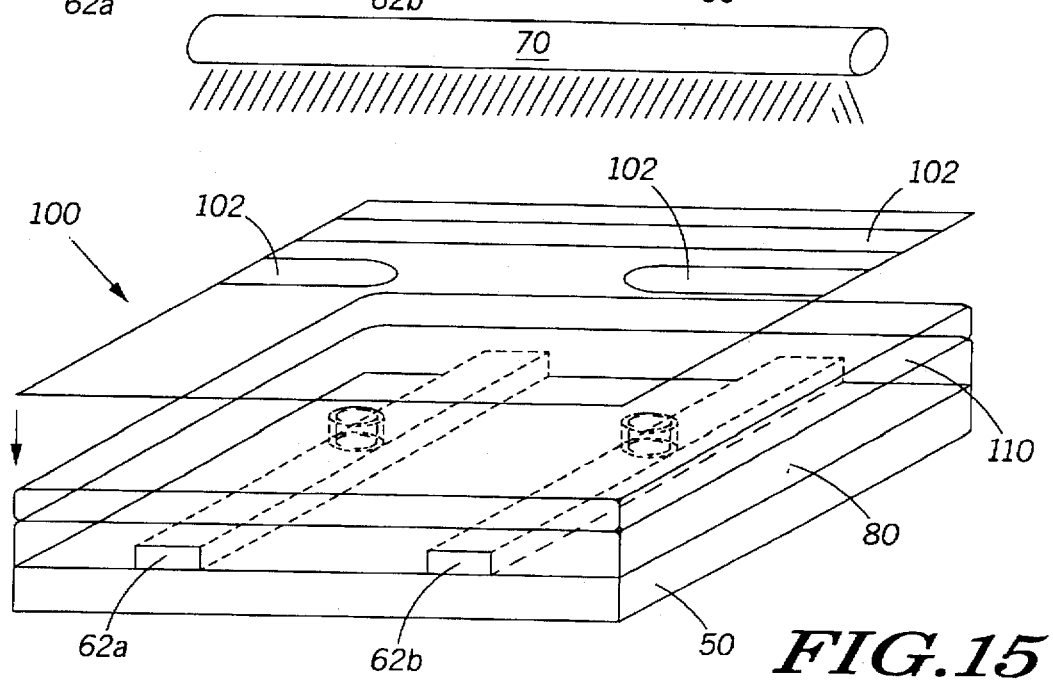
FIG. 15. illustrates the steps of masking and imaging a dielectric layer.
Figure 16:
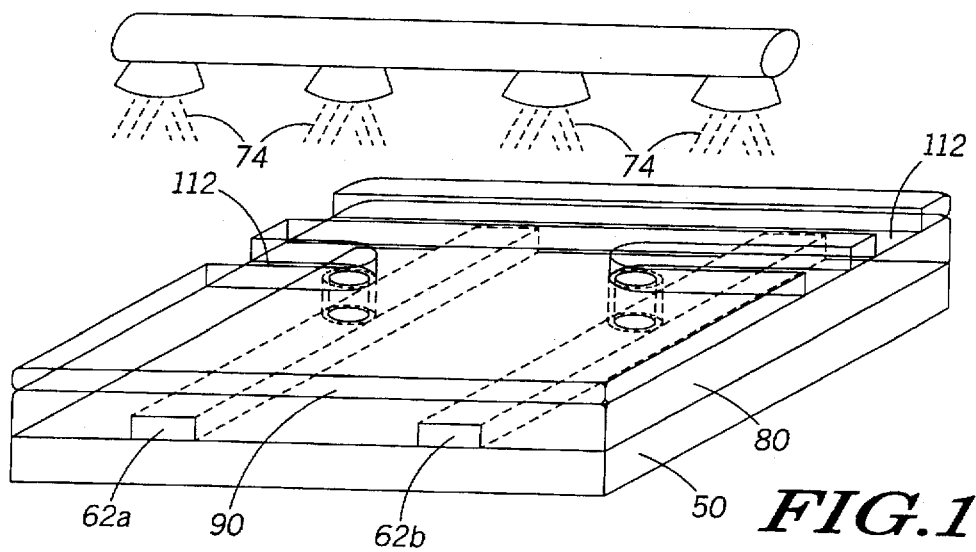
FIG. 16. illustrates the steps of developing a dielectric layer
Figure 17:
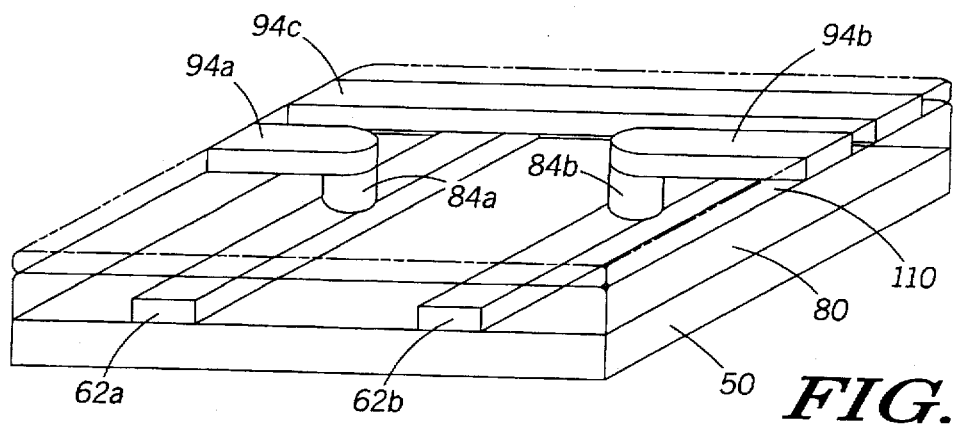
FIG. 17. illustrates the steps of plating the exposed sensitized dielectric surface with conductor material.

The cured dielectric top surface 81 provides a mounting surface for conductor circuitry. In accordance with the instant invention, copper conductors are formed on the dielectric surface by the following additive process. First, the dielectric surface is chemically sensitized by a process that prepares the dielectric surface such that copper readily adheres thereto. As illustrated in FIG. 14, a layer of photoresist 110 is then applied over the sensitized dielectric layer 80 and allowed to dry. Next, as best illustrated in FIG. 15, the photoresist layer 110 is masked with a transparent sheet 100 containing opaque areas 102 corresponding to the desired circuitry layout. The masked photoresist is exposed to ultra-violet radiation source 70 thereby causing exposed portions of photoresist to cure. The partially cured photoresist layer is developed, as illustrated in FIG. 16, thereby removing uncured portions, with a suitable chemical solution 74 such that portions 112 of said sensitized dielectric surface, representing areas for conductor circuitry, are exposed. Copper conductors 94a–c are formed upon said exposed, sensitized, dielectric portions 112 by an additive electroless process and built up to a suitable thickness, depending on the application (i.e. anticipated current flow), by an electroplating process, thereby forming conductor circuitry.

Figure 18:
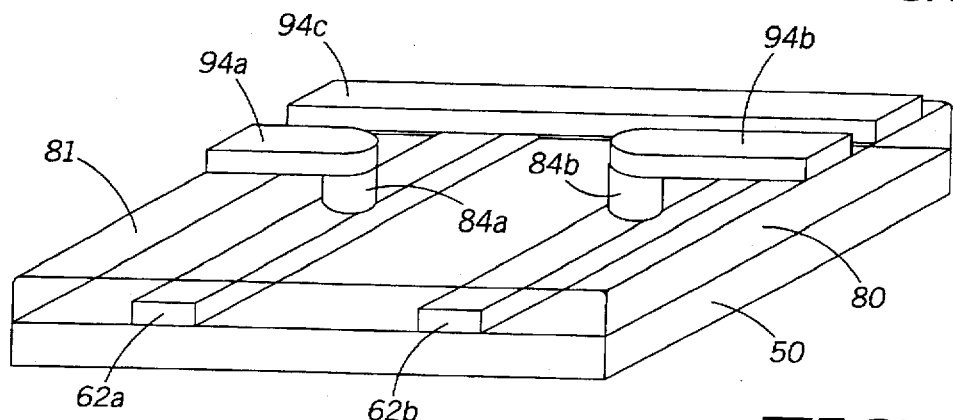
FIG. 18. illustrates conductors formed on the dielectric surface

The instant method is capable of defining conductor widths of 0.001"–0.002", whereas prior art subtractive methods are generally limited to forming conductors having widths of 0.003"–0.004". Accordingly, the instant method allows for the production of chip carriers having higher density conductor patterns thereby further reducing required chip carrier size, and/or allowing for a greater number conductors per unit area. In addition, the instant additive process is more efficient and results in less waste as compared to prior art subtractive techniques for forming conductor circuitry. Once the conductor circuitry is formed on the dielectric surface, the remaining (cured) photoresist is stripped by a chemical solution such that conductors 94a–c exist on dielectric surface 81. As depicted in FIG. 18, conductors 94a and 94b are in contact with underlying conductors 62a and 62b respectively by conducting via junctions 84a and 84b. Other conductors, such as conductor 94c, remain insulated from underlying conductors 62a and 62b by dielectric layer 80.

Additional layers are formed by coating the lastly completed conductor layer with dielectric, masking, imaging, developing, plating vias, sensitizing, coating with photoresist, masking, imaging, developing, additive conductor formation, and stripping, in accordance with the previously described method steps. These steps are repeated as often as necessary to form a complete multi-layered chip carrier. As is now apparent the instant method results in a multi-layer structure having an overall reduced thickness attributable to the use of thin (0.0007"–0.0009") dielectric insulating layers in lieu of layers of relatively thick (0.003"–0.004") prior art core material.

As is now apparent, the instant method is equally useful and advantageous in fabricating multi-layer chip packaging, especially chip packaging having layers defining a cavity in which an integrated circuit die is disposed. In accordance with the instant method, multi-layer chip packaging is fabricated by forming layers of conductors separated by insulating dielectric layers, generally as previously described. As previously noted, multi-layer chip packages are typically constructed with layers of insulating material separating patterned conductor circuitry having end portions exposed in a central cavity. In cross section, the cavity is staircase-shaped so that the end portions of each layer are exposed to provide bonding areas for attachment of bonding wires which connect to a centrally mounted semiconductor chip. Bonding pad areas are finished by plating the pad area with successive layers of copper, nickel, and gold, providing a suitable structure for the connection of bonding wires. The conductor circuitry provides electrical connection to leads which protrude from the package for external connection to other devices, such as printed circuit boards.

Figure 12:
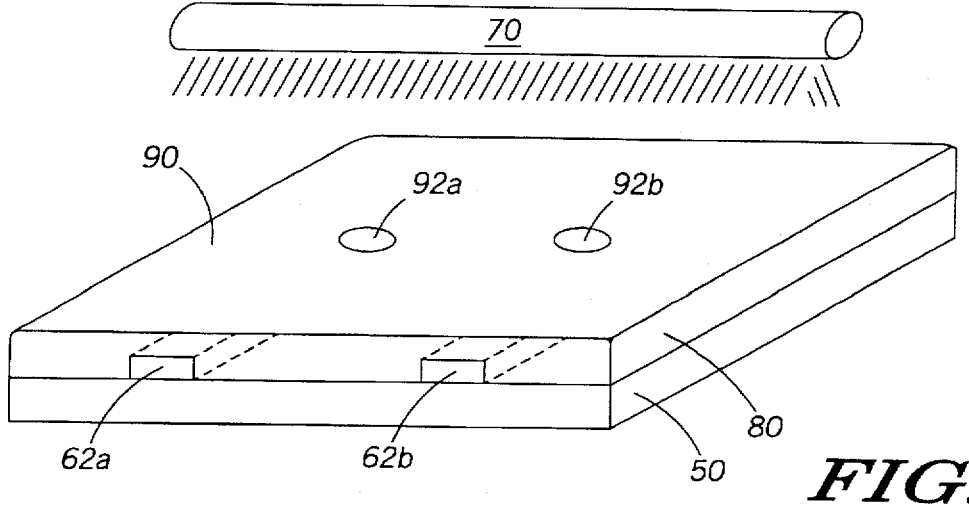
FIG. 12. illustrates the steps of imaging of a masked dielectric layer.

The instant invention greatly simplifies the fabrication of the aforementioned central cavity by eliminating the need for mechanically routing, cleaning and finishing the cavity opening in the rigid core material, and allowing the cavity opening to be formed by masking a dielectric layer with a sheet having an opaque region corresponding to the desired size and shape of the cavity opening, imaging the masked dielectric, and developing the dielectric layer, in accordance with the steps illustrated in FIGS. 11–13. As is now apparent, the instant invention thus allows for the formation of a wide variety of opening configurations that are either impractical or impossible with the prior art methods.

Figure 19:
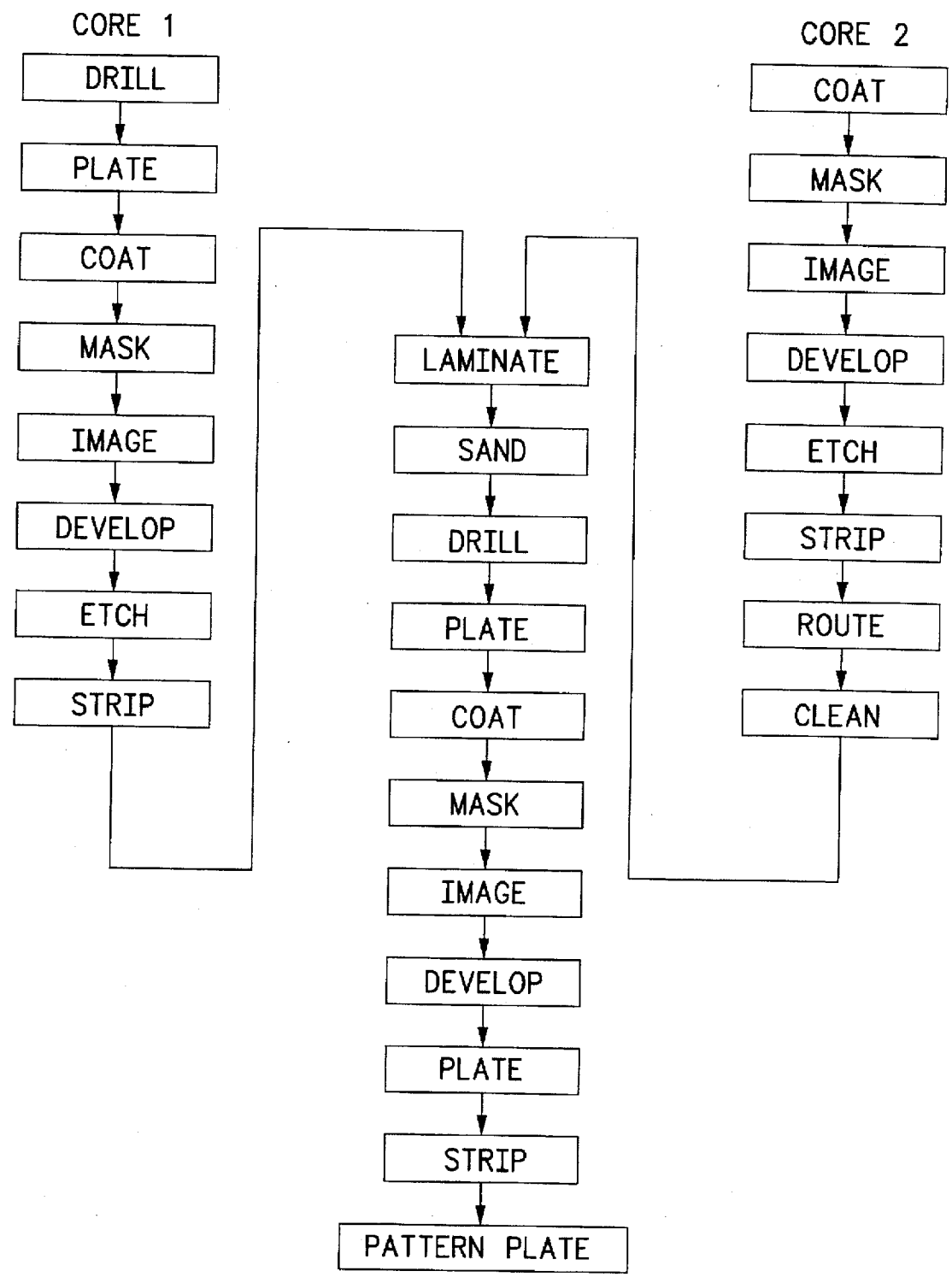
FIG. 19. is a flow chart of the prior art method for producing multilayer chip carriers.
Figure 20:
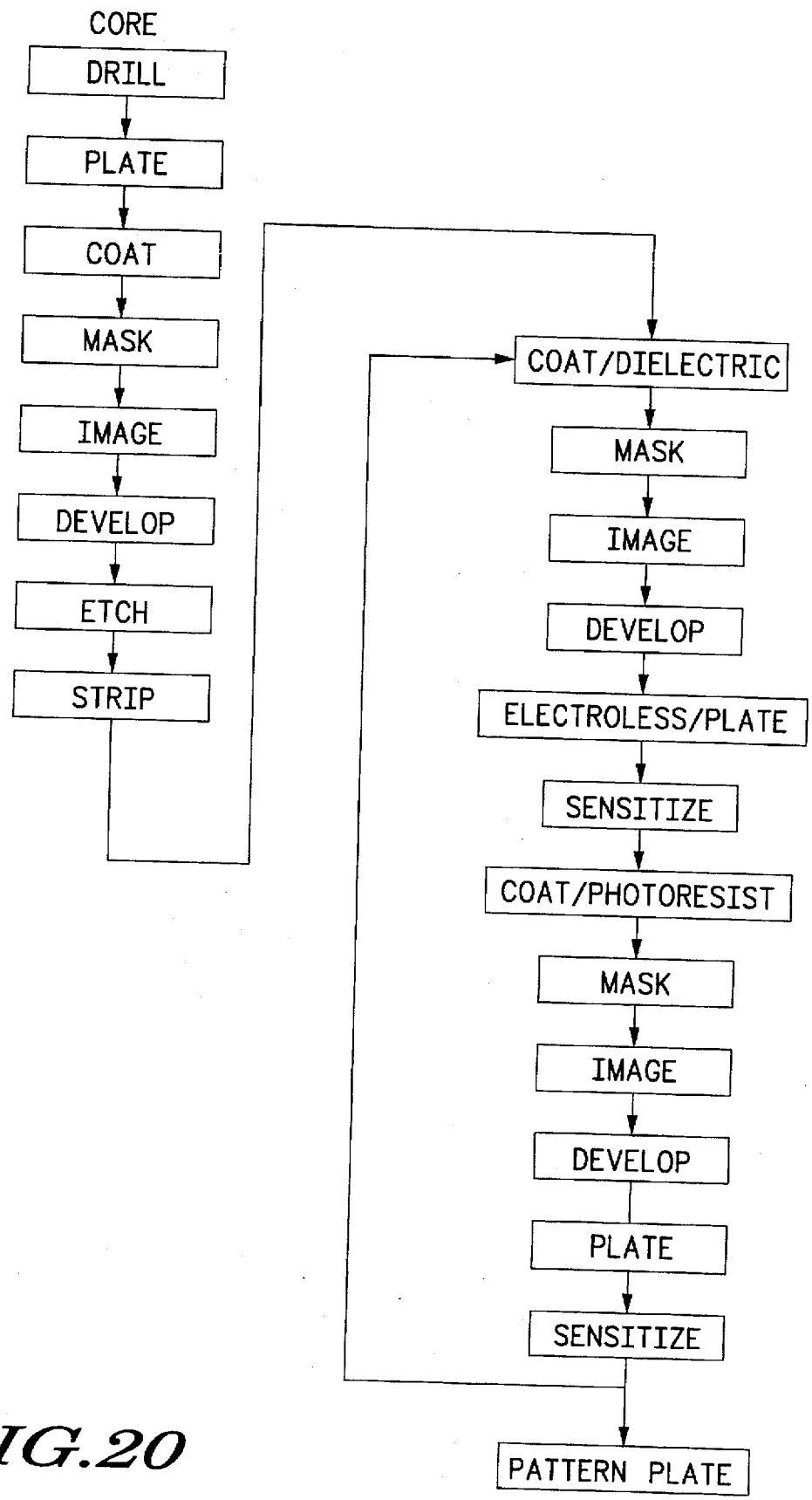
FIG. 20. is a flow chart of a method for producing multi-layer chip carriers in accordance with the instant invention.

FIG. 19 is a flowchart depicting the prior art multi-layer chip carrier fabrication process. FIG. 20 is a flowchart depicting the instant method of producing multi-layer chip carriers. Significantly, the instant method improves upon the prior art by, among other things, eliminating the mechanical steps of laminating, sanding, drilling, and routing.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A method for producing multi-layer integrated circuit carriers upon a base layer of core material having a surface with conductors forming a circuit pattern, including the steps of:
   (a) coating the base layer surface with a photosensitive dielectric material to form thereupon a dielectric layer;
   (b) curing at least a portion of the dielectric layer and removing uncured photosensitive dielectric material;
   (c) depositing a catalyst upon the cured portion of the dielectric layer to form a sensitized dielectric layer;
   (d) applying a photoresist layer upon the sensitized dielectric layer;
   (e) curing at least a portion of the photoresist layer;
   (f) developing the cured photoresist layer by removing uncured portions, thereby exposing corresponding portions of the underlying sensitized dielectric layer;
   (g) forming conductors on the sensitized dielectric layer which is exposed;
   (h) stripping thee cured photoresist layer;
   (i) coating a layer of photosensitive dielectric material upon the cured dielectric layer; and
   (j) repeating steps (b) through (i) to produce successive dielectric layers sufficient to form a multi-layer chip carrier having a plurality of layers of conductors forming circuit patterns thereon, the circuit patterns providing interconnects to an integrated circuit chip.

2. A method for producing multi-layer integrated circuit carriers according to claim 1, further including
   forming an opening in the sensitized dielectric layer which is exposed by masking the photosensitive dielectric material with a transparent sheet having at least one opaque area thereon corresponding to the size and location of a desired opening,
   imaging the masked dielectric layer by exposure to a suitable radiation source causing exposed portions of the photosensitive dielectric material to cure, and
   developing the masked dielectric layer by removing uncured photosensitive dielectric material, thus forming an opening in the dielectric layer, the opening defined by an inner wall.

3. A method for producing multi-layer integrated circuit carriers according to claim 2, wherein the opening defines a cavity for receiving the integrated circuit chip.

4. A method for producing multi-layer integrated circuit carriers according to claim 2, wherein the opening in the sensitized dielectric layer defines a via communicating with a conductor existing on an underlying layer.

5. A method for producing multi-layer integrated circuit carriers according to claim 6, further including the steps of plating the via inner wall with electrically conducting material.

6. A method for producing multi-layer integrated circuit carriers according to claim 3, including the step of attaching the integrated circuit chip to a substrate within the cavity and wirebonding the integrated circuit chip to the conductors on the chip carrier.

7. A method for producing multi-layer integrated circuit carriers according to claim 6, including the step of encapsulating the integrated circuit chip within the cavity thereby forming an integrated circuit package.

8. A method for producing multi-layer integrated circuit carriers according to claim 7, wherein conductors are formed upon the sensitized dielectric layer which are exposed by an additive plating process.

9. A method for producing multi-layer integrated circuit carriers according to claim 7, wherein the sensitized dielectric layer has a thickness of less than 0.0009 inches.

10. A method for producing multi-layer integrated circuit carriers according to claim 7, wherein each of the conductors are formed having a width of less than 0.002 inches.

11. A method for producing multi-layer integrated circuit carriers including the steps of:
   (a) coating a surface of a core layer of epoxy coated glass weave having patterned electrical conductors thereon with a photosensitive dielectric material to form thereupon a dielectric layer;
   (b) masking the dielectric layer with a partially transparent sheet whereby predetermined portions of the photosensitive dielectric material are masked by opaque areas contained on the sheet;
   (c) imaging the masked dielectric layer by exposure to a suitable radiation source thereby curing exposed dielectric;
   (d) developing the masked dielectric layer with a chemical solution thereby removing uncured photosensitive dielectric material and creating openings therein communicating with the underlying patterned electrical conductors;
   (e) depositing a catalyst upon the cured portion the surface of the cured dielectric layer to form a sensitized dielectric layer;

(f) applying a photoresist layer over the sensitized dielectric layer;

(g) masking the photoresist layer with a transparent sheet containing opaque areas corresponding to a desired circuitry layout;

(h) exposing the masked photoresist layer to a suitable radiation source thereby curing portions of the photoresist layer which are unmasked;

(i) developing the photoresist layer using a chemical solution to remove uncured portions of the photoresist layer such that portions of the sensitized dielectric layer, representing areas for conductor circuitry, are exposed;

(j) forming conductors upon the exposed sensitized dielectric layer;

(k) stripping the cured photoresist layer using a chemical solution;

(l) plating bonding pad areas with successive layers of copper, nickel, and gold;

(m) applying a layer of photosensitive dielectric material over the cured dielectric layer having patterned electrical conductors thereon; and (n) repeating steps (b) through (m) to produce successive dielectric layers sufficient to form a multi-layer chip carrier.

12. A method for producing multi-layer integrated circuit carriers including the steps of:

(a) coating a layer of photosensitive dielectric material, having a thickness less than 0.0009", over a surface of a core layer having patterned electrical conductors thereon, and allowing the photosensitive dielectric material to harden thereby forming a dielectric layer;

(b) masking the dielectric layer with a transparent sheet having opaque areas thereon corresponding to the size and location of desired openings in the dielectric layer such that predetermined portions of the dielectric layer are masked by the opaque areas contained on the sheet;

(c) imaging the masked dielectric layer by exposure to ultraviolet radiation source thereby curing portions of the dielectric layer which are unmasked;

(d) developing the masked dielectric layer with a chemical solution containing a concentration of 1%–3% sodium carbonate, thereby removing uncured portions of the photosensitive dielectric material and creating openings in the dielectric layer communicating with the underlying surface;

(e) depositing a catalyst upon the cured portion of the dielectric layer to form a sensitized dielectric layer and thereby creating a surface suitable for forming conductors thereon by an additive electroless process;

applying a photoresist layer over the sensitized dielectric layer and allowing the photoresist layer to harden;

(g) masking the photoresist layer with a transparent sheet containing opaque areas corresponding to a desired conductor circuitry layout;

(h) exposing the masked photoresist layer to an ultraviolet radiation source thereby curing portions of the photoresist layer which are unmasked;

(i) developing the photoresist layer using a chemical solution containing a concentration of 1%–3% sodium carbonate, to remove uncured portions of the photoresist layer such that portions of the sensitized dielectric layer, representing areas for conductor circuitry are exposed, the exposed portions of the sensitized dielectric layer defining individual conductors each having a width less that 0.002";

(j) forming conductors upon the exposed sensitized dielectric layer by an additive electroless process;

(k) stripping the cured photoresist layer using a chemical solution having a concentration of 5%–7% sodium carbonate, resulting in patterned conductor circuitry formed on the sensitized dielectric layer;

(l) plating bonding pad areas with successive layers of copper, nickel, and gold;

(m) applying a layer of photosensitive dielectric material over the cured dielectric layer having patterned electrical conductors thereon; and (n) repeating steps (b) through (m) to produce successive dielectric layers sufficient to form a multi-layered chip carrier.

* * * * *